United States Patent
Koshizaka et al.

(10) Patent No.: US 6,710,745 B2
(45) Date of Patent: Mar. 23, 2004

(54) HIGH-FREQUENCY COMMUNICATION APPARATUS AND METHOD OF MANUFACTURING THE SAME

(75) Inventors: Atsushi Koshizaka, Hitachinaka (JP); Shirou Oouchi, Hitachinaka (JP); Mizuho Yokoyama, Hitachinaka (JP); Keiji Kawahara, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/320,642

(22) Filed: Dec. 17, 2002

(65) Prior Publication Data

US 2003/0122727 A1 Jul. 3, 2003

Related U.S. Application Data

(63) Continuation of application No. 09/772,890, filed on Jan. 31, 2001, now Pat. No. 6,580,395.

(30) Foreign Application Priority Data

Jan. 31, 2000 (JP) .......................................... 2000-27216

(51) Int. Cl.$^7$ ................................................ H01Q 1/38
(52) U.S. Cl. ................................ 343/700 MS; 343/872
(58) Field of Search ................................ 343/872, 702, 343/700 MS, 841

(56) References Cited

U.S. PATENT DOCUMENTS

| | | | |
|---|---|---|---|
| 3,777,286 A | 12/1973 | Cramm et al. | 333/70 S |
| 6,043,793 A | * 3/2000 | Tamura et al. | 343/872 |
| 6,118,978 A | 9/2000 | Ihmels | 455/12.1 |
| 6,163,072 A | 12/2000 | Tatoh | 257/704 |
| 6,337,661 B1 | 1/2002 | Kondoh et al. | 343/700 |

FOREIGN PATENT DOCUMENTS

| | | | |
|---|---|---|---|
| CH | 660934 A5 | 5/1987 | ......... H01R/13/719 |
| EP | 1049192 A2 | 11/2000 | ............. H01P/1/16 |

OTHER PUBLICATIONS

U.S. patent application Ser. No. 09/557,827, Title: High Frequency Communication Device, filed on Apr. 25, 2000.
European Search Report dated May 25, 2001.
"60 GHz Band Millimeter Wave Rader Unit", 1997 Denshi Joho Tsushin Gakkai Sogo Taikai, C–2–121.
"RF, Microwave and Millimeter Wave, Single and Multi–Function Components and subassemblies", M/A-COM, 1996.
"Effect of Conductor Losses in New–Structure Filters for Suppressing Microwave Leakage", Kohi Iwabuchi et al., Electronice & Communications in Japan Part II—Electronics, US, Scripta Technica. New York, vol. 75, No. 9, Sep. 1, 1992, pp. 80–89.
Webster's Encyclopedic Unabridged Dictionary of the English Language, 1989, pp. 401 and 506.

* cited by examiner

*Primary Examiner*—Hoang V. Nguyen
(74) *Attorney, Agent, or Firm*—McDermott, Will & Emery

(57) ABSTRACT

A high-frequency communication apparatus has a case containing a transmitter-receiver including circuit elements. A functional structure capable of confining radiation energy radiated by unnecessary radio wave source to prevent the radiation energy from interfering with the operations of the transmitter-receiver is formed on at least one of the walls of the case by forming a plurality of projections in regular arrangement by press working. The circuit elements of the transmitter-receiver are packed in the case to suppress the undesired electromagnetic coupling of internal and external electromagnetic waves with the circuit elements of the transmitter-receiver.

16 Claims, 4 Drawing Sheets

HIGH-FREQUENCY COMMUNICATION APPARATUS AND METHOD OF MANUFACTURING THE SAME

This application is a continuation of application Ser. No. 09/772,890 filed Jan. 31, 2001, which issued as U.S. Pat. No. 6.580,395 to Koshizaka et al. on Jun. 17, 2003.

BACKGROUND OF THE INVENTION

The present invention relates to a high-frequency communication apparatus and, more specifically, to a high-frequency communication apparatus comprising high-frequency circuit elements capable of processing signals of frequencies in a microwave frequency band or a millimeter wave frequency band, and a case containing those high-frequency circuit elements, and a method of manufacturing the high-frequency communication apparatus.

Multifunctional circuit elements have been developed for the miniaturization and cost reduction of automotive radar units using a millimeter wave or high-frequency communication apparatuses and radio terminals using radio waves of frequencies in a frequency band of 300 MHz or above. Those communication apparatuses are formed by containing a single multifunctional semiconductor device, a semiconductor integrated circuit (IC), an IC package formed by packaging an IC, a plurality of interconnected ICs or a high-frequency circuit element having a filtering function in a case. A transmitter-receiver for an automotive radar unit disclosed in "60 GHz Band Millimeter Wave Radar Unit:, 1997 Denshi Joho Tsushin Gakkai Sogo Taikai, C-2-121 is an example of such a communication apparatus. This radar unit has a transmitter-receiver circuit which receives and transmits millimeter wave signals (signals of frequencies in a 60 GHz band) contained in a case having flat surfaces. A RF subsystem shown in a catalog "RF, Microwave and Millimeter Wave, Single and Multi-Function Components and subassemblies" of M/A-COM, USA, 1996 is another example of such a communication apparatus. This RF subsystem has a plurality of RF functional circuit elements contained in a case. The internal space of the case is divided into a plurality of sections by metallic walls to reduce adverse effects due to interference between the functional circuit elements.

When packing a plurality of functional circuit elements in one case, the physical distances between the functional circuit elements decreases as the number of the functional circuit elements increases when the size of the case is fixed or the size of the case is large as compared with half the free-space wavelength at a signal frequency, such as about 1.95 mm at 77 GHz. In either case, radio wave energy of a signal frequency radiated from one point on an IC or the like included in a functional circuit element placed in the case are able to propagate easily in the case and causes various functional troubles in other functional circuit elements packed in the same case. For example, in a communication transmitter-receiver and a transmitter-receiver module for an automotive millimeter wave radar unit, part of a signal radiated into a case by a transmitting functional circuit element affects the function of a receiving functional circuit element and causes troubles including the saturation of a receiver and increase in the noise level of received signals.

To prevent such troubles in a case that may be caused by interference between signals in the case, the inner space of the case of a conventional communication apparatus is divided into a plurality of small rooms by metallic walls or a metallic structure that functions as a local cutoff waveguide for cutting off unnecessary radiation is disposed on a signal passage. These prior art techniques need a complicated metallic structure in the case, need a high-frequency wiring board of a passive circuit to be divided into a plurality of parts. These structures and the division of the wiring board into a plurality of parts make the arrangement of semiconductor ICs and passive circuit components difficult, which has been an impediment to the mass production and cost reduction of the communication apparatus.

The applicant of the present patent application has previously filed patent applications: Japanese Patent Laid-open No. Hei 11-118047 (U.S. Patent Application No. 09/557,827 (filed Apr. 25, 2000), Eur. Pat. App. No. 00108878.0 (filed Apr. 26, 2000) to propose means for solving the foregoing problems.

SUMMARY OF THE INVENTION

The present invention relates to improvements in the previous proposals and it is an object of the present invention to control impediments to the mass production and/or the cost reduction of communication apparatuses and to provide a high-frequency communication apparatus capable of suppressing interference between electromagnetic waves inside and outside a case, i.e., undesired electromagnetic coupling of circuit elements packed in a case or undesired coupling of circuit elements packed in a case and electromagnetic waves prevailing outside the case.

With the foregoing object in view, the present invention provides a high-frequency communication apparatus comprises high-frequency circuit elements which deal with signals of a frequency in a high-frequency band, such as microwave signals or millimeter wave signals, antenna, and a case containing at least the high-frequency circuit elements; wherein projections are formed in a pattern by press working at least in part of walls forming the case. The part provided with the projections of the walls of the case serves as a filter that attenuates signals of frequencies in a frequency band including the frequencies of unnecessary radio waves that cause troubles in the case.

The high-frequency communication apparatus of the present invention is capable of preventing radiation energy radiated by unnecessary radio wave radiating sources placed in the case from adversely affecting other circuit elements packed in the case by confining the radiation energy in local regions and of radiation energy radiated by unnecessary external radio wave radiating sources from interfering with the operation of the circuit elements packed in the case by attenuating the radiation energy. If radio waves of different frequencies that cause troubles exist in the case, a plurality of kinds of problems attributable to the interference of those radio waves in the operation of the circuit elements can be dealt with by forming projections in patterns on proper parts of the walls of the case. When projections are formed in a pattern on the top wall of the case and the top wall is used as a cover, the case can be formed in a simple shape, such as the shape of a rectangular solid, of a size far greater than the wavelength, a single large high-frequency wiring board can be used, semiconductor devices can be easily disposed in the case, and a module including the case can be manufactured at a low cost.

DESCRIPTION OF THE PREFERRED EMBODIMENTS

Preferred embodiments of the present invention will be described with reference to FIGS. 1 to 8.

Figure 1:
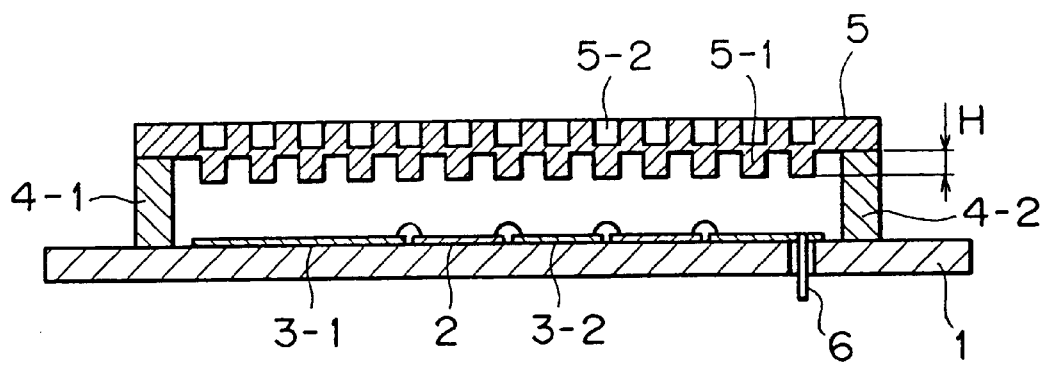
FIG. 1 is a sectional view of a high-frequency communication apparatus in a first embodiment according to the present invention in the form of a transmitter-receiver for transmitting and receiving microwaves or millimeter waves.
Figure 2:
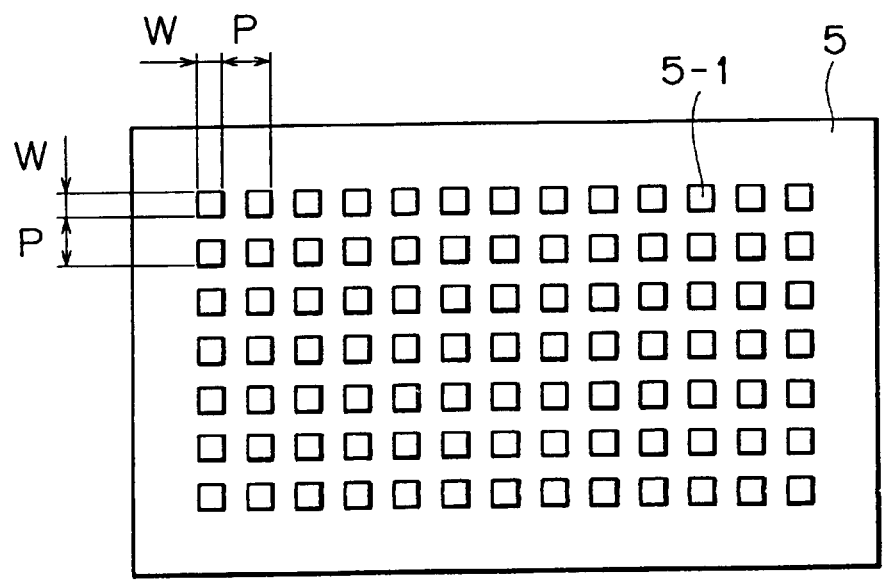
FIG. 2 is a plan view of a cover of a case shown in FIG. 1 as viewed from inside the case.
Figure 3:
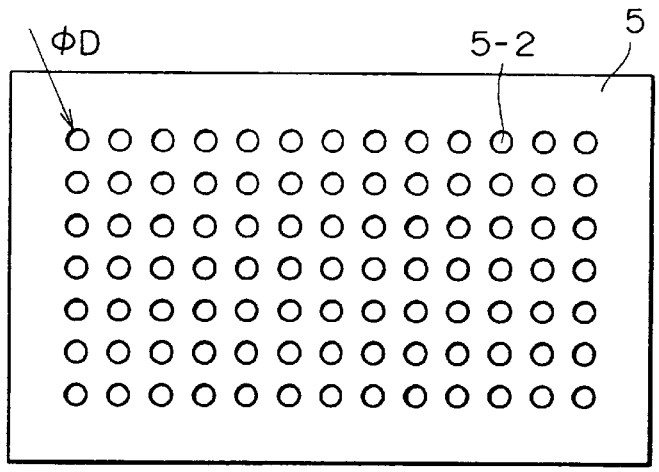
FIG. 3 is plan view of the cover of the case shown in FIG. 1 as viewed from outside the case.

FIG. 1 is a sectional view of a high-frequency communication apparatus in a first embodiment according to the present invention in the form of a transmitter-receiver for transmitting and receiving microwaves or millimeter waves. Semiconductor devices 2, such as MMICs for signal transmission and reception and flat wiring boards 3-1 and 3-2 for electrically connecting the MMICs are mounted on a base plate 1 of a metal to form a transmitter-receiver circuit. A case has a bottom wall, a top wall and side walls 4-1 and 4-2. The base plate 1 serves also as the bottom wall of the case. The transmitter-receiver circuit is connected to an antenna, not shown, by a coaxial cable 6. Input signals received by the antenna are transmitted through the coaxial cable 6 to the transmitter-receiver circuit. Output signals provided by the transmitter-receiver circuit is transmitted through the coaxial cable 6 to the antenna. A cover 5 of a metal serving also as the top wall of the case is put on the side walls 4-1 and 4-2 of the case. The side walls 4-1 and 4-2 may be formed of either a metal or a nonmetallic material, such as glass or alumina. Projections 5-1 having a height H and the shape of a rectangular solid are formed on the inner surface of the cover 5 facing the interior of the case in a regular pattern by press working. FIG. 2 is a plan view of the cover 5, showing the inner surface of the cover 5 provided with the projections 5-1. The projections 5-1 are arranged at equal longitudinal and lateral intervals over the substantially entire inner surface of the cover 5. The projections 5-1 have a cross section having the shape of a square whose side is W. The projections 5-1 are arranged at longitudinal and lateral pitches P. FIG. 3 is a plan view of the cover 5, showing the outer surface of the cover 5. Recesses 5-2 corresponding to the projections 5-1 are formed at equal longitudinal and lateral intervals over the substantially entire outer surface of the cover 5. The recesses 5-2 are cylindrical holes of a diameter D having a sectional area approximately equal to that of the projections 5-1.

The inner surface of the cover 5 provided with the regularly arranged projections 5-1 forms, together with the surface of the base plate 1 of a metal, a filter structure having a regularly varying surge impedance to microwaves or millimeter waves propagating in the case. The filter structure has a characteristic of alternate propagation frequency bands and nonpropagation frequency bands as a function of frequency. Thus, undesired radiation entered the case is prevented from reaching the transmitter and the receiver of the transmitter-receiver circuit and the interference of the undesired radiation with transmission and reception can be suppressed. This filter structure can be formed by cutting, grinding, etching or press working. Cutting and grinding need much machining time when a large number of projections are to be formed, form burrs and need a burr removing process. Consequently, cutting and grinding are unsatisfactory in productivity and costly. Etching is suitable for forming many projections simultaneously. However, etching is unable to form the projections in an accurate shape and takes much time when the height of the projections is great and hence is not suitable for the mass production of the cover provided with the projections. Press working may be suitable for forming the projections. A method according to the present invention of forming the cover 5 by press working will be described.

Figure 4:
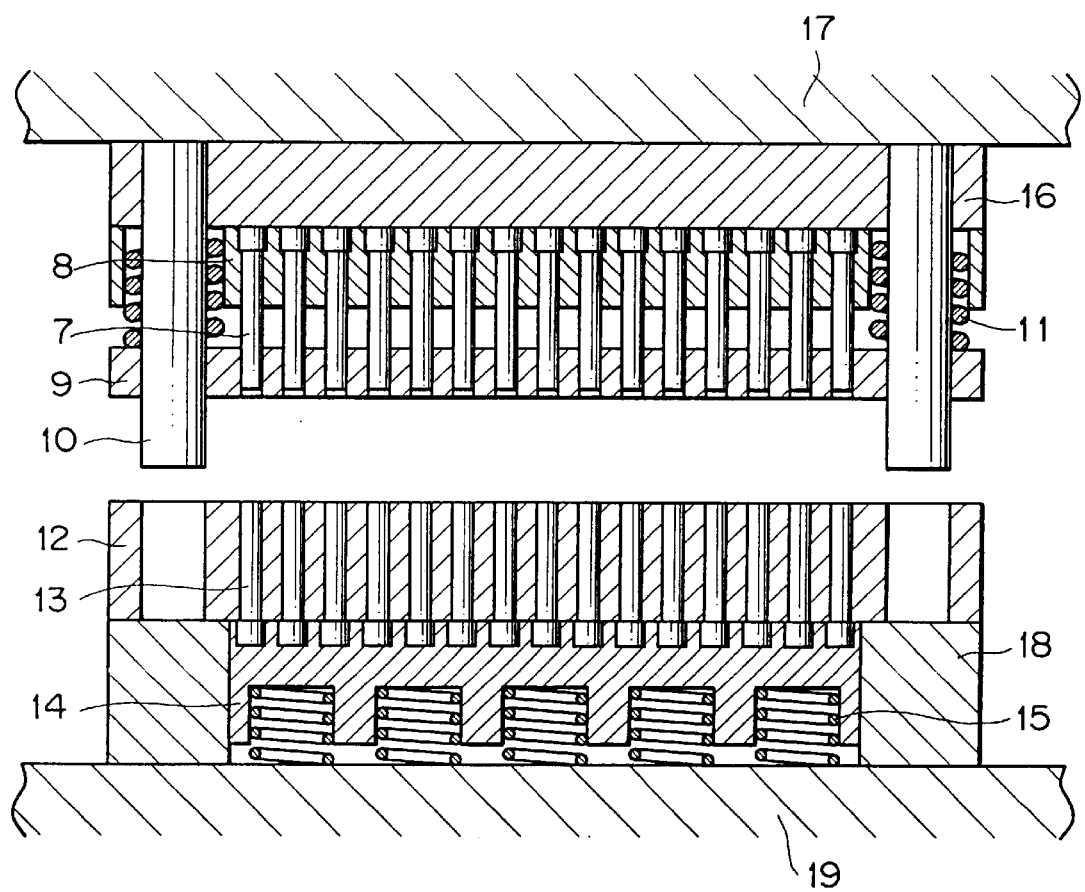
FIG. 4 is a longitudinal sectional view of dies for forming the cover of the case shown in FIG. 1 by press working.
Figure 5:
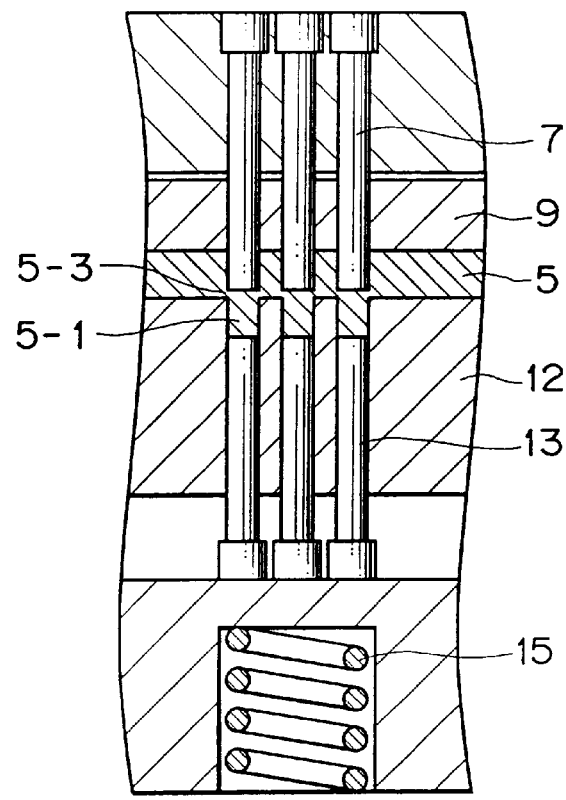
FIG. 5 is an enlarged sectional view of a part of a workpiece being processed by using punches and a die shown in FIG. 4.
Figure 6:
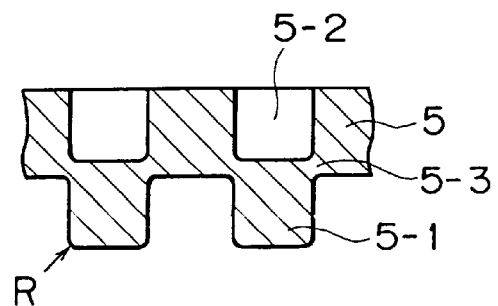
FIG. 6 is a fragmentary sectional view of projections formed in the cover shown in FIG. 1.

FIG. 4 is a longitudinal sectional view of a die assembly for forming the projections 5-1 of the cover 5. Punches 7 are fixedly fitted in holes formed in a pressure plate 8. Free end portions of the punches 7 are fitted in and guided by holes formed in a stripper 9. The stripper 9 is guided by guide pins 10 for vertical movement and is biased downward by compression springs 11 The punches 7 has a diameter D, which is equal to the diameter of the recesses 5-2 of the cover 5. The punches 7 are arranged regularly at pitches P. A die 12 is provided with holes 12-1 of a square cross section whose side is W. The holes 12-1 are arranged regularly at pitches P so as to correspond to the projections 5-1, respectively. Counter punches 13 are inserted in the holes 12-1. A cushion plate 14 is pressed against the lower ends of the counter punches 13 by compression springs 15 to apply a cushioning pressure to the counter punches 13. A male die 16 is attached to a slide plate 17 included in a pressing device, and a female die 18 is attached to a base plate 19 included in the pressing device. The male die 16 is moved vertically together with the slide plate 17 along the guide pins 10 for press-forming work. FIG. 5 shows a part of a workpiece being processed by using the punches 7 and the die 12 shown in FIG. 4. A workpiece for forming the cover 5 (not yet provided with the projections 5-1 and recesses 5-2) is set on the die 12. The workpiece is pressed against the die 12 by the stripper 9, and then the punches 7 are pressed against the workpiece for press working. A cushioning pressure is applied to the counter punches 13 by the compression springs 15 during press working. Portions of the workpiece are projected by the punches 7 to form the projections 5-1. The cushioning pressure is applied to the projections 5-1 during press working. Press working is completed when the counter punches 13 and the cushion plate 14 are pressed down to their lowermost positions. If the cushioning pressure is not applied to the counter punches 13, the workpiece is subject to free elongation and cracks are liable to develop in the roots 5-3 of the projections 5-1. Cracks develop remarkably when the height H of the projections 5-1 is big as compared with the thickness T of the cover 5. If the cushioning pressure is not applied to the counter punches 13, end portions of the projections 5-1 are not formed in a satisfactory dimensional accuracy, which deteriorates the filtering function of the projections 5-1. The cushioning pressure induces a compressive stress in the end portions of the projections 5-1, which improves the dimensional accuracy of the end portions and provides the projections 5-1 with a satisfactory filtering function.

Experimental press working conducted by using the punches 7, the die 12 and the counter punches 13 will be described.

Two hundred and fifty projections 5-1 having a height H of 0.7 mm and a square cross section having sides of a width W of 0.9 mm were formed at pitches P of 1.9 mm in twenty-five rows and ten columns in a regular pattern, and cylindrical recesses 5-3 having a diameter D were formed at pitches P of 1.9 mm in twenty-five rows and ten columns so as to correspond to the projections 5-1, respectively, in a cold-rolled steel plate of 1.0 mm in thickness. Cracks developed in the roots 5-3 of the projections 5-1 when a diameter D was 0.9 mm and H was 0.75. When a diameter D was 1.0 mm, any cracks did not develop while H was 0.85 mm or below. Although a diameter D of 1.1 mm or above, similarly to a diameter D of 1.0 mm, was effective in suppressing the development of cracks, the same increases the warp of the plate and reduces the flatness of the plate, which may possibly deteriorate the filtering function of the cover 5. When a diameter D was 1.0 mm, corners of the extremities of projections 5-1 formed without applying any cushioning pressure to the counter punches 13 were rounded in radii R (FIG. 6) in the range of 0.3 to 0.35 mm and corners of the extremities of projections 5-1 formed with a cushioning pressure applied to the counter punches 13 were rounded in radii R in the range of 0.10 to 0.15 mm. This proves that the application of a cushioning pressure to the counter punches 13 improves the dimensional accuracy of the projections 5-1.

The method according to the present invention is capable of forming a filter structure of a satisfactory quality at a high productivity.

Figure 7:
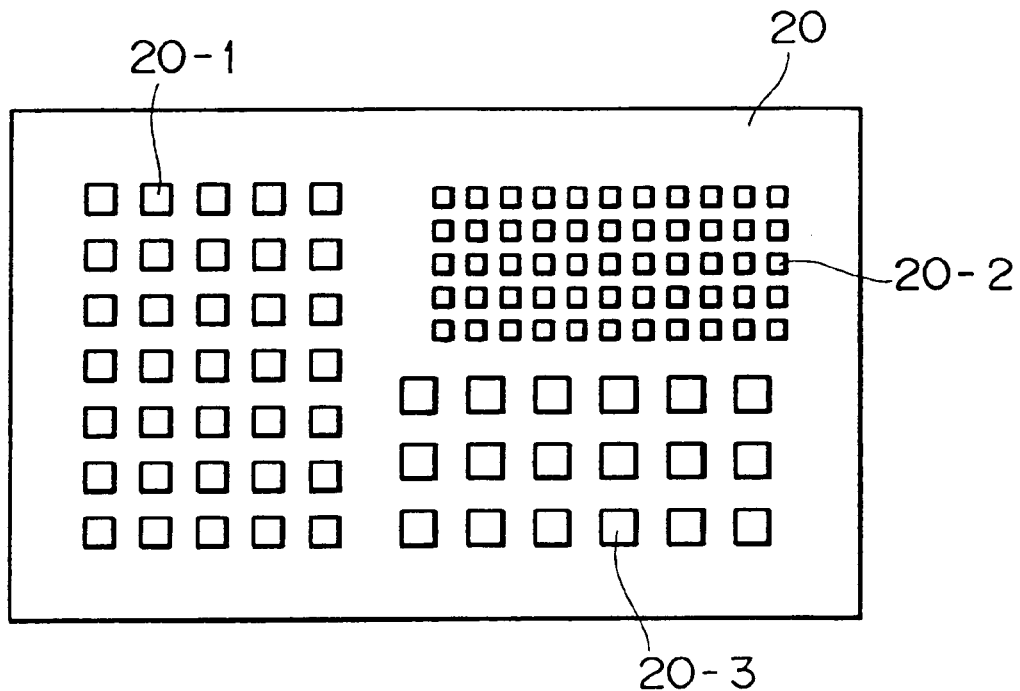
FIG. 7 is a plan view of a cover included in a high-frequency communication apparatus in a second embodiment according to the present invention.

FIG. 7 is a plan view of a cover included in a high-frequency communication apparatus in a second embodiment according to the present invention. In this embodiment, functional devices that deal with signals of three different frequencies, respectively, are packed in a case. A cover 20 is provided on its inner surface with three different filter structures. The filter structures are regular arrangement of projections 20-1, 20-2 and 20-3 respectively corresponding to design frequencies. The filter structures are capable of effectively suppressing interference between the different functional devices. The projections 20-1, 20-2 and 20-3 can be formed by the foregoing method by using a die assembly similar to that shown in FIG. 4 and including a die provided with holes arranged in a pattern corresponding to the pattern of the projections 20-1, 20-2 and 20-3, and having sizes corresponding to those of the projections 20-1, 20-2 and 20-3, and punches and counter punches associated with the holes of the die.

Figure 8:
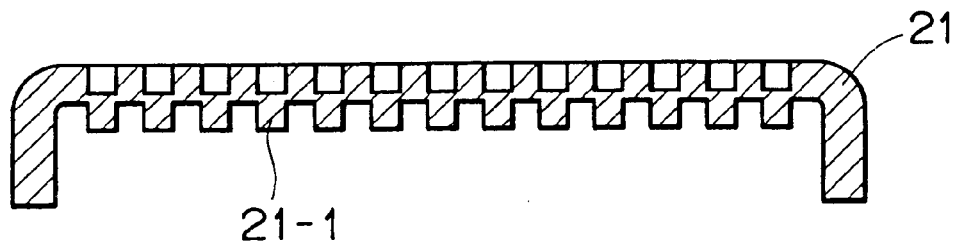
FIG. 8 is a sectional view of a cover included in a high-frequency communication apparatus in a third embodiment according to the present invention.

FIG. 8 is a sectional view of a cover included in a high-frequency communication apparatus in a third embodiment according to the present invention. As shown in FIG. 8, a cover 21 integrally having parts corresponding to the side walls 4-1, 4-2 and the cover 5 shown in FIG. 1 is formed by a drawing process, and projections 21-1 are formed by press working on the inner surface of the top wall of the cover 21. This cover 21 reduces the number of parts, simplifies assembling work and reduces the cost.

Although the invention has been described in its preferred embodiments, the present invention is not limited thereto in its practical application. For example, the projections 5-1 may be formed so as to meet a desired filtering characteristic in any suitable shape having a cross section other than the square cross section. For example, the projections 5-1 may be formed in a cylindrical shape. Punches 7 and counter punches 13 having a round cross section are advantageous in manufacturing cost over those having a square cross section. A hydraulic device may be used instead of the compression springs 15 to apply the cushioning pressure to the counter punches 13.

According to the present invention, the filtering structure can be formed on the case for containing a high-frequency communication device by a simple method. The filtering structure reduces greatly problems arising from the interference of unnecessary radiation energy, EMC and EMI, and a highly functional, multifunctional high-frequency communication apparatus can be manufactured at a low cost without deteriorating the general characteristic thereof.

What is claimed is:

1. A high-frequency communication apparatus comprising:
    a high-frequency circuit element,
    an antenna,
    a case containing at least the high-frequency circuit element therein, and
    a plurality of projections formed on at least one wall of the case, wherein the longitudinal and lateral pitch between the plurality of projections are substantially equal.

2. The high-frequency communication apparatus according to claim 1, wherein the plurality of projections is formed on an inner surface of the at least one wall of the case.

3. The apparatus of claim 1, wherein the projections are rectangular in cross-section.

4. The apparatus of claim 1, wherein the projections are adapted to have a regularly varying surge impedance to microwaves or millimeter waves.

5. The apparatus of claim 1, wherein the projections are adapted to have a characteristic of alternate propagation bands and non-propagation frequency bands as a function of frequency.

6. The apparatus of claim 1, wherein a plurality of recesses are formed substantially corresponding in position to positions of at least some of the plurality of projections.

7. A method for forming a noise reduction structure in a high-frequency communication apparatus that comprises a high-frequency circuit element, an antenna, and a case containing at least the high-frequency circuit element therein, the method comprising the step of:
    forming a plurality of projections on at least one wall of the case by press working;
    wherein the at least one wall having the plurality of projections is made of metal.

8. The method of claim 7, wherein the plurality of projections disposed on the at least one wall of the case is formed simultaneously by press working.

9. A method for fabricating a case for containing a high-frequency communication element therein, comprising the step of:
    forming a plurality of projections in regular arrangement on at least one wall of the case by press working;
    wherein the at least one wall of the case having the plurality of projections disposed thereon is made of metal.

10. The method of claim 9, wherein the plurality of projections disposed on the at least one wall of the case is formed simultaneously by press working.

11. A high-frequency communication apparatus comprising:
    a high-frequency circuit element,
    an antenna,
    a case containing at least the high-frequency circuit element therein,
    a plurality of projections formed on at least one wall of the case, and
    a plurality of recesses formed substantially corresponding in position to positions of at least some of the plurality of projections.

12. The high-frequency communication apparatus according to claim 11, wherein the plurality of projections is formed on an inner surface of the at least one wall of the case.

13. The apparatus of claim 11, wherein the projections are rectangular in cross-section.

14. The apparatus of claim 11, wherein the longitudinal and lateral pitch between the projections are substantially equal.

15. The apparatus of claim 11, wherein the projections are adapted to have a regularly varying surge impedance to microwaves or millimeter waves.

16. The apparatus of claim 11, wherein the projections are adapted to have a characteristic of alternate propagation bands and non-propagation frequency bands as a function of frequency.

\* \* \* \* \*